US008001514B2

(12) United States Patent
Chang et al.

(10) Patent No.: US 8,001,514 B2
(45) Date of Patent: Aug. 16, 2011

(54) METHOD AND APPARATUS FOR COMPUTING A DETAILED ROUTABILITY ESTIMATION

(75) Inventors: Douglas Chang, San Jose, CA (US); Neeraj Kaul, Fremont, CA (US); Balkrishna Rashingkar, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 573 days.

(21) Appl. No.: 12/108,123

(22) Filed: Apr. 23, 2008

(65) Prior Publication Data
US 2009/0271754 A1    Oct. 29, 2009

(51) Int. Cl.
*G06F 17/50* (2006.01)
(52) U.S. Cl. ......... 716/129; 716/126; 716/130; 716/131
(58) Field of Classification Search .............. 716/12–14, 716/126–131
See application file for complete search history.

(56) References Cited

U.S. PATENT DOCUMENTS

| 4,831,725 | A | * | 5/1989 | Dunham et al. | 29/847 |
|---|---|---|---|---|---|
| 5,673,201 | A | | 9/1997 | Malm | |
| 5,784,289 | A | | 7/1998 | Wang | |
| 5,798,936 | A | | 8/1998 | Cheng | |
| 6,058,254 | A | * | 5/2000 | Scepanovic et al. | 716/2 |
| 7,681,165 | B2 | * | 3/2010 | Peters et al. | 716/9 |
| 2001/0014965 | A1 | | 8/2001 | Hiraga | |
| 2005/0108669 | A1 | * | 5/2005 | Shibuya | 716/9 |
| 2008/0059931 | A1 | * | 3/2008 | Peters et al. | 716/9 |

OTHER PUBLICATIONS

Kastner, Ryan et al., "Predictable Routing", pp. 110-113, XP-002245296, 2000 IEEE.

* cited by examiner

*Primary Examiner* — Paul Dinh
*Assistant Examiner* — Nha T Nguyen
(74) *Attorney, Agent, or Firm* — Park, Vaughan, Fleming & Dowler LLP; Laxman Sahasrabuddhe

(57) ABSTRACT

One embodiment of the present invention provides a system that computes a routability estimation across a collection of local routing regions associated with a circuit layout. This system first selects a first local routing region associated with a route overflow, wherein a respective local routing region is associated with an estimation of a number of route overflows for routing layers in a region of the circuit layout. Furthermore, a respective routing layer is associated with a preferred direction variable D. Next, the system transfers an overflow value k in direction d away from an overflowing routing layer for the first local routing region to a second local routing region, which has the capacity to handle an overflow of k or more routes in a direction d. Finally, the system computes a global routability estimation as a function of a global overflow cost and an adjacent overflow cost.

25 Claims, 10 Drawing Sheets

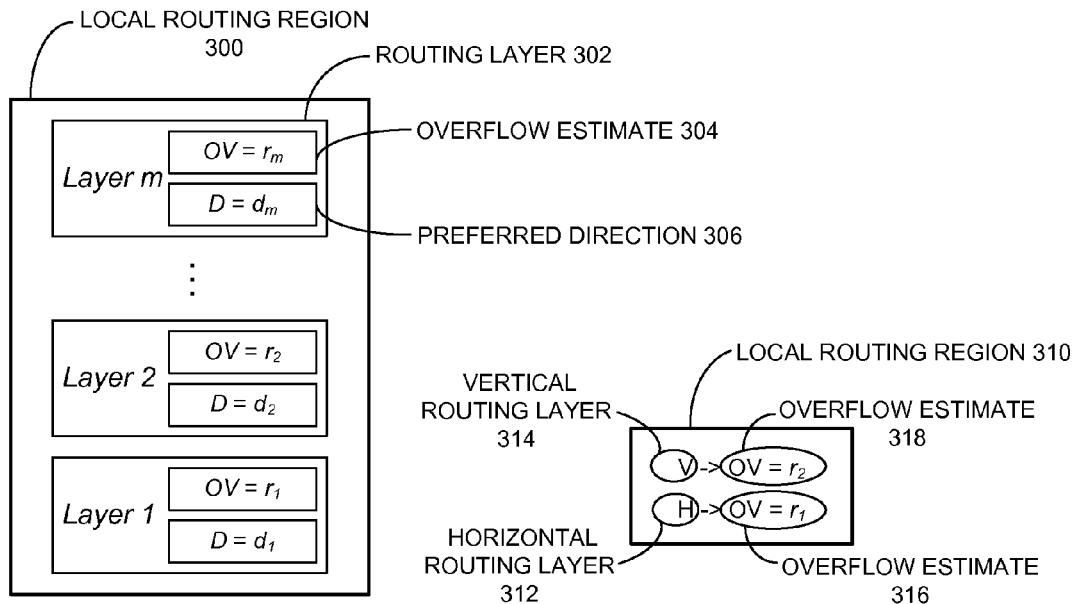
FIG. 3A
FIG. 3B
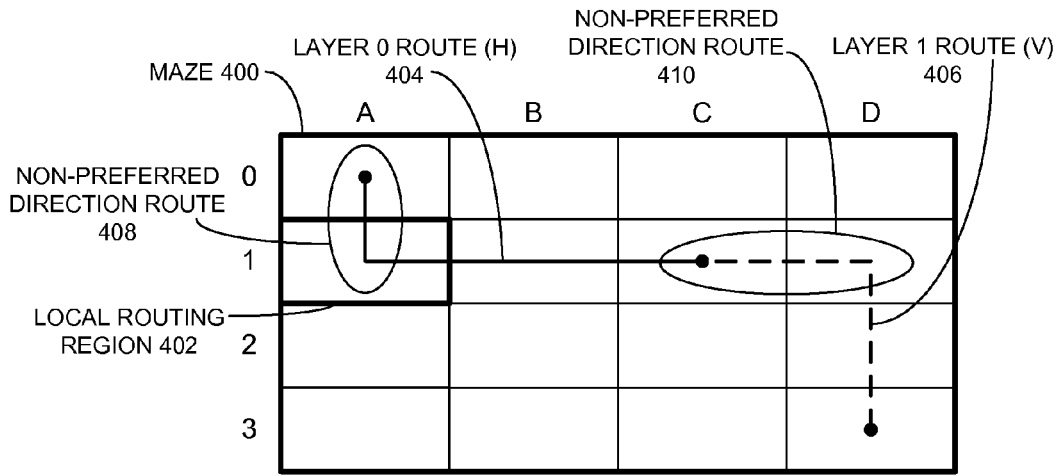
FIG. 4

MAZE 500, ROUTE WINDOW 502

|   | A | B | C | D | E | F |
|---|---|---|---|---|---|---|
| 0 |   |   |   |   |   |   |
| 1 | V->OV=-3<br>H->OV=0 | V->OV=-3<br>H->OV=0 | V->OV=3<br>H->OV=-4 | V->OV=0<br>H->OV=-4 | V->OV=-1<br>H->OV=-4 | V->OV=-3<br>H->OV=0 |
| 2 |   |   |   |   |   |   |

FIG. 5A

MAZE 500

|   | A | B | C | D | E | F |
|---|---|---|---|---|---|---|
| 0 |   |   |   |   |   |   |
| 1 |   |   | ǀ |   |   |   |
| 2 |   |   |   |   |   |   |

FIG. 5B

MAZE 500

|   | A | B | C | D | E | F |
|---|---|---|---|---|---|---|
| 0 |   |   |   |   |   |   |
| 1 | V->OV=-3<br>H->OV=0 | V->OV=-3<br>H->OV=0 | V->OV=2<br>H->OV=-3 | V->OV=0<br>H->OV=-3 | V->OV=0<br>H->OV=-3 | V->OV=-3<br>H->OV=0 |
| 2 |   |   |   |   |   |   |

FIG. 5C

MAZE 500

|   | A | B | C | D | E | F |
|---|---|---|---|---|---|---|
| 0 |   |   |   |   |   |   |
| 1 |   |   | ●——|——●|   |
| 2 |   |   |   |   |   |   |

MAZE 600, ROUTE WINDOW 602

| | A | B | C | D | E | F |
|---|---|---|---|---|---|---|
| 0 | | | | | | |
| 1 | V->OV=5<br>H->OV=-12 | V->OV=5<br>H->OV=-12 | V->OV=4<br>H->OV=-2 | V->OV=4<br>H->OV=-12 | V->OV=1<br>H->OV=-12 | V->OV=1<br>H->OV=-10 |
| 2 | | | | | | |

FIG. 6B

MAZE 600

| | A | B | C | D | E | F |
|---|---|---|---|---|---|---|
| 0 | | | | | | |
| 1 | | | | | | |
| 2 | | | | | | |

FIG. 6C

MAZE 600

| | A | B | C | D | E | F |
|---|---|---|---|---|---|---|
| 0 | | | | | | |
| 1 | V->OV=5<br>H->OV=-12 | V->OV=5<br>H->OV=-9 | V->OV=3<br>H->OV=-1 | V->OV=4<br>H->OV=-12 | V->OV=1<br>H->OV=-12 | V->OV=1<br>H->OV=-10 |
| 2 | | | | | | |

FIG. 6D

MAZE 600, ROUTE 604

| | A | B | C | D | E | F |
|---|---|---|---|---|---|---|
| 0 | | | | | | |
| 1 | | | | | | |
| 2 | | | | | | |

METHOD AND APPARATUS FOR COMPUTING A DETAILED ROUTABILITY ESTIMATION

BACKGROUND

1. Field of the Invention

The present invention generally relates to techniques for computing a routability estimation for a floorplan of a circuit design. More specifically, the present invention relates to a system that redistributes route overflow values away from over-congested local routing regions, and towards under-congested local routing regions to compute a routability estimation on a floorplan.

2. Related Art

Performing a detailed routing operation for a circuit design's floorplan is an expensive process that can take several days to complete. To make matters worse, a detailed routing operation is not always guaranteed to succeed. Detailed routing is therefore not a practical process to use when experimenting on several versions of designs to assess routability.

A global router is commonly used as a first-pass routing tool for a given floorplan of a circuit design. It arranges routes across a floorplan by analyzing the floorplan as a collection of local routing regions, and by arranging the routes between the local routing regions. The global router produces a global route solution, which is then passed on to a detailed router to complete the routing task. It is common for the global route solution to include route overflows associated with a number of local routing regions. Unfortunately, these route overflows may or may not be resolved by the subsequent detailed routing operation.

Given that a detailed router is not always guaranteed to succeed, a global router also performs a simplistic routability analysis for a given floorplan to enable an engineer to predict whether a detailed router will be able to complete the routing operation. A successful routability analysis is important because it can allow an engineer to optimize a floorplan for routability before the floorplan is processed by a detailed router, thus preventing a number of wasted detailed routing efforts. A commonly used method for routability analysis comprises examining the percentage of local routing regions that have an overflow of routes after a global routing operation. In this analysis, an overflow is defined as the excess demand for available tracks compared to the overall capacity of the local routing regions. Typically, if the overflow percentage is greater than 2% for a floorplan, the floorplan is deemed unroutable. This method for estimating the routability of a design is not accurate given that it often leads to false positives, and can even lead to false negatives. Moreover, this method is limited in its analysis for the routability of a floorplan because it does not consider the capabilities and limitations of a detailed router.

SUMMARY

One embodiment of the present invention provides a system that computes a routability estimation across a collection of local routing regions associated with a circuit layout. This system first selects a first local routing region associated with a route overflow, wherein a respective local routing region is associated with an estimation of a number of route overflows that would be experienced by a detailed router for routing layers in a region of the circuit layout. Furthermore, a respective routing layer is associated with a preferred direction variable D and is associated with either an overflow of R routes or an excess capacity of C routes. Next, the system transfers an overflow value k in a direction d away from an overflowing routing layer for the first local routing region to a second local routing region, which has a capacity to handle an overflow of k or more routes in the direction d. Finally, the system computes a global routability estimation as a function of a global overflow cost and an adjacent overflow cost.

In some embodiments, transferring an overflow value k away from an overflowing routing layer for the first local routing region to a second local routing region involves searching for a second local routing region with sufficient excess capacity. During this process, the system performs a first search for a second local routing region which has a receiving routing layer associated with an excess capacity of at least C=k routes in the preferred direction d. If the first search does not succeed, the system performs a second search for a second local routing region which has a receiving routing layer associated with an excess capacity of at least C=n*k routes in a non-preferred direction $\bar{d}$. The variable n is a non-preferred direction factor which denotes a number of tracks that are used to accommodate a route in the non-preferred direction of a routing layer. If a second local routing region is found, the systems transfers the overflow value C to the receiving layer of the second local routing region.

In some embodiments, the system transfers an overflow value k away from an overflowing routing layer with a preferred direction D=d for the first local routing region to a second local routing region with one or more routing layers associated with a non-preferred direction D=$\bar{d}$ and a combined excess capacity of at least C=n*k routes.

In some embodiments, when the system searches for the second local routing region, the system ensures that a path exists from the first local routing region to the second local routing region through a number of adjoining local routing regions associated with an excess capacity of k or more routes in the preferred direction.

In some embodiments, when the system searches for the second local routing region, the search capabilities emulate the capabilities associated with a search window of a detailed router.

In some embodiments, the system transfers the overflow value C to the receiving layer of the second local routing region by first subtracting an overflow value k from the overflowing routing layer of the first local routing region. Next, the system adds the overflow value k to the adjoining local routing regions between the first local routing region and the second local routing region. Finally, the system adds the overflow value C to the receiving routing layer of the second local routing region.

In some embodiments, computing the global routability estimation across a collection of local routing regions involves computing a sum of the global overflow cost and the adjacent overflow cost:

cost=global_overflow_cost+adjacent_overflow_cost.

In some embodiments, computing the global overflow cost across a collection of local routing regions comprises computing the cost as a function $f$ of the sum of overflows across every layer i of every local routing region:

$$\text{global\_overflow\_cost} = f\left(\sum_i \text{overflow\_across\_layer}_i\right).$$

In some embodiments, computing the adjacent overflow cost comprises computing the sum of the costs across a number of clusters j of adjacent local routing regions, wherein the cost g of a cluster is a function of the number of local routing regions in the cluster and the sum of the overflows across the cluster:

$$\text{adjacent\_overflow\_cost} = \sum_j g(\text{No\_AdjCells}_j, \text{Overflow\_AdjCells}_j).$$

In some embodiments, the non-preferred direction $\bar{d}$ is orthogonal to the preferred direction d In some embodiments, a local routing region is associated with an estimation of overflows and excess capacity in a first routing layer with a corresponding direction D=d, and comprises an estimation of overflows and excess capacity in a second routing layer with a corresponding direction D=$\bar{d}$.

In some embodiments, the estimation of overflows at a layer in a local routing region is represented by a positive value of a variable OV, wherein the estimation of excess capacity at the layer in the local routing region is represented by a negative value of the variable OV.

BRIEF DESCRIPTION OF THE FIGURES

FIGS. 3A-3B illustrate a local routing region in accordance with an embodiment of the present invention.

FIG. 4 illustrates an exemplary maze comprising a number of local routing regions in accordance with an embodiment of the present invention.

FIGS. 5A-5D illustrate an exemplary outcome from transferring an overflow value to a receiving routing layer by using the preferred directions in accordance with an embodiment of the present invention.

FIGS. 6A-6D illustrate an exemplary outcome from transferring an overflow value to a receiving routing layer by using the preferred and non-preferred directions in accordance with an embodiment of the present invention.

DETAILED DESCRIPTION

Figure 1:
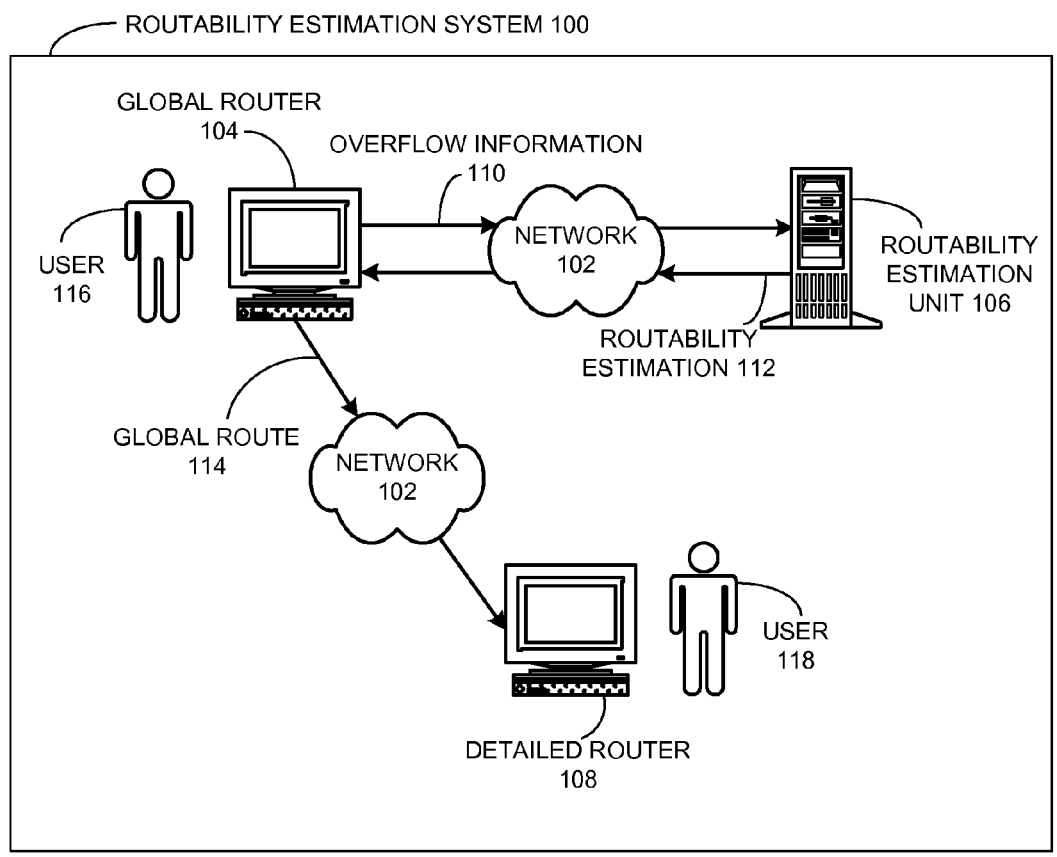
FIG. 1 illustrates a routability estimation system in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

Detailed routing of a circuit design is an expensive process, and it does not always guarantee that a circuit's floorplan is routable. It is therefore important to predict the routability of a design to determine whether a floorplan is routable before attempting to perform detailed routing on the floorplan. Embodiments of the present invention provide a system that computes a routability estimation for a floorplan of a circuit design based on the route overflow information that is extracted from a global routing operation for a collection of local routing regions. (Note that a collection of local routing regions associated with a floorplan is referred to as a "maze" throughout the remainder of this disclosure.)

This system uses a respective local routing region to specify a number of route overflows (or conversely, an excess capacity of routes) associated with a horizontal or a vertical direction. This system computes a routability estimation for a floorplan of a circuit design by first attempting to spread the route overflow values away from the over-congested local routing regions, and toward the under-congested local routing regions. This system does not move routes physically across a maze, but instead computes the outcome of such moves before computing a design rule check (DRC) estimation.

Routability Estimation System

FIG. 1 illustrates a routability estimation system 100 in accordance with an embodiment of the present invention. Routability estimation system 100 includes a global router 104, a routability estimation unit 106, a detailed router 108, and a network 102. Network 102 can include any type of wired or wireless communication channel. In one embodiment of the present invention, network 102 includes the Internet.

Global router 104 can include any node with computational capability and a communication mechanism for communicating with routability estimation unit 106 and with detailed router 108 through network 102. Global router 104 allows user 116 to arrange and interconnect a collection of standard cells into a circuit layout floorplan. First, these standard cells are assigned to a collection of local routing regions based on their floorplan location. Then, global router 104 attempts to route the interconnections between these local routing regions. After global router 104 has attempted to route the interconnections between local routing regions, global router 104 transfers overflow information 110 to routability estimation unit 106. In response, global router 104 receives routability estimation 112 from routability estimation unit 106. If the cost due to route overflow is above a predefined threshold, user 116 can modify the floorplan and/or standard cell placement to alleviate any reported overflows. Otherwise, route overflow unit 104 transfers global route 114 to detailed router 108.

Routability estimation unit 106 can include any node with computational capability and a communication mechanism for communicating with global router 104 through network 102. Routability estimation unit 106 receives overflow information 110 from global router 104, and initiates a sequence of operations which redistribute the overflows across the local routing regions as a means to estimate the routability of the floorplan. Next, routability estimation unit 106 computes routability estimation 112 and transfers routability estimation 112 to global router 104.

Detailed router 108 can include any node with computational capability and a communication mechanism for communicating with global router 104 through network 102. Detailed router 108 receives global route 114 from global router 104, and performs a series of operations to route the interconnections between local routing regions, and to route the interconnections between standard cells within local routing regions.

Users 116-118 can be an individual, a group of individuals, an organization, a group of organizations, a computing system, a group of computing systems, or any other entity that can interact with routability estimation system 100.

Figures 2A, 2B:
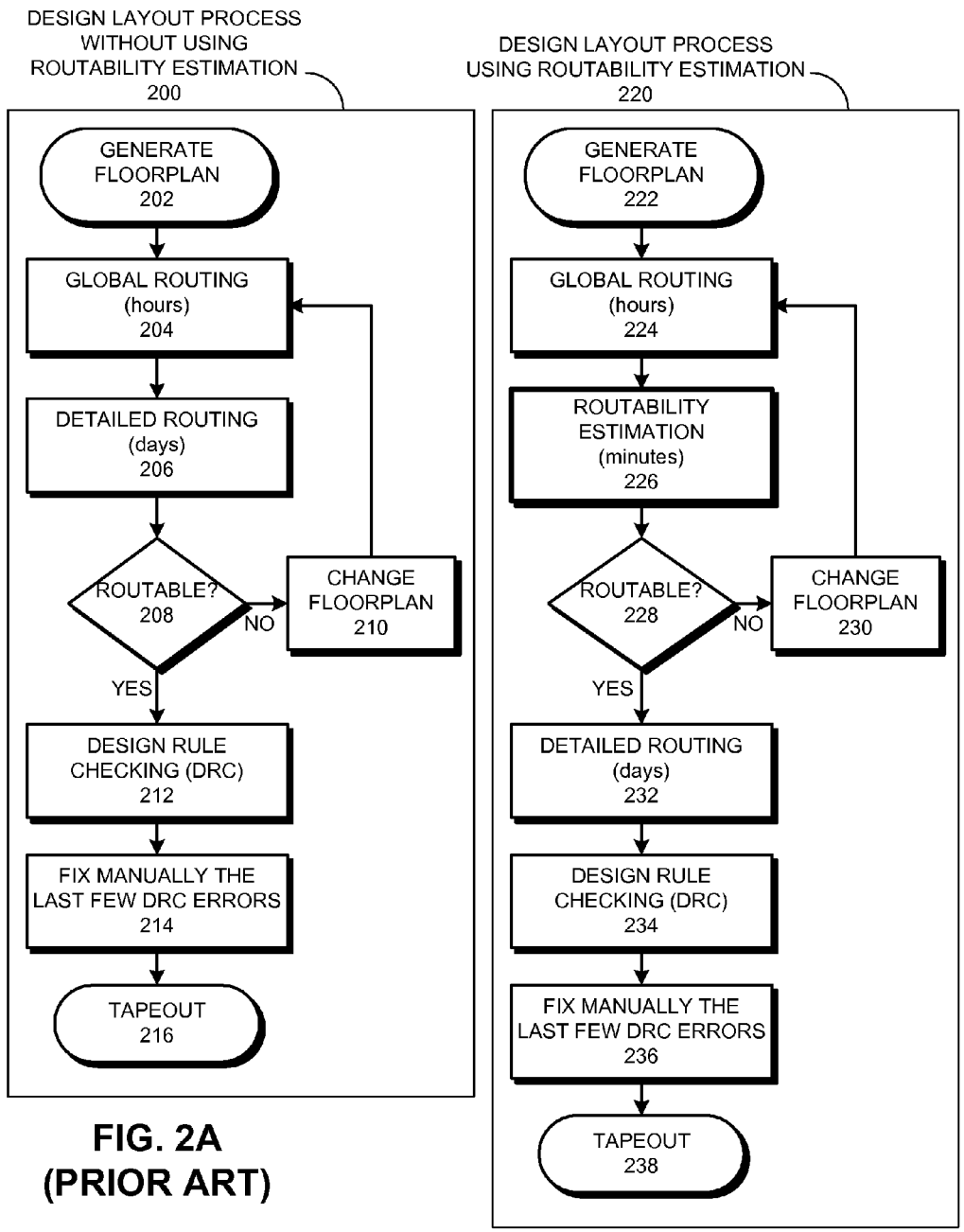
FIG. 2 presents contrasting flowcharts illustrating the benefit of a design layout process which uses routability estimation in accordance with an embodiment of the present invention.

Note that different embodiments of the present invention may use different configurations, and are not limited to the configuration illustrated in routability estimation system 100. In some embodiments of the present invention, global router 104 includes routability estimation unit 106 and/or detailed router FIG. 2 presents contrasting flowcharts illustrating the benefit of a design layout process which uses routability estimation in accordance with an embodiment of the present invention. FIG. 2A presents a flowchart illustrating a design layout process 200 without using routability estimation. In this process, a user first generates a floorplan for a circuit layout (operation 202) and uses a global router to route the interconnections between local routing regions (operation 204). Next, the user uses the detailed router to route the interconnections between local routing regions, and between the standard cells within the local routing regions to produce a circuit layout (operation 206). The user needs to determine if the detailed router has successfully routed the floorplan (operation 208). The success or failure of a detailed router is determined by the magnitude (number) of design rule errors (DRC errors) present in the design after detailed routing. If the detailed router fails to route the floorplan, the user changes the floorplan (operation 210) and returns to operation 204 to perform global routing and detailed routing once again. If the detailed router succeeds in routing the floorplan into a circuit layout, the user performs design rule checking (DRC) on the circuit layout (operation 212) and manually fixes the last few DRC errors (operation 214) before commencing tapeout (operation 216).

The detailed router typically takes a number of days to complete its operation; therefore, any failed detailed route attempt has a cost penalty on the order of days. To mitigate the cost penalty associated with an unroutable floorplan, embodiments of the present invention employ routability estimation as an operation which allows a user to determine whether the floorplan can be routed by a detailed router.

FIG. 2B presents a flowchart illustrating a design layout process 220 using routability estimation. In this process, a user first generates a floorplan for a circuit layout (operation 222) and uses a global router to route the interconnections between local routing regions (operation 224). Unlike FIG. 2A, the user continues on to use routability estimation to predict a number of DRC violations that will be encountered before attempting to perform detailed routing (operation 226). A routability estimation unit accepts overflow information from global router 104 as its input, and computes a routability estimation. Next, the user needs to determine whether the floorplan is routable based on the routability estimation (operation 228). If the user determines that the design is not routable due to too many overflowing routes, the user changes the floorplan (operation 230) and returns to operation 224 to perform global routing and routability estimation once again. Otherwise, the user proceeds to use the detailed router to produce a circuit layout (operation 232). The detailed router accepts the global route output from the global router, and routes the interconnections between local routing regions, and between the standard cells within the local routing regions to produce a circuit layout. Next, the user performs design rule checking (DRC) on the circuit layout (operation 234) and manually fixes the last few DRC errors (operation 236) before commencing tapeout (operation 238).

Routability estimation typically takes a number of minutes (less than an hour) to complete its operation, which delays the expensive operation of performing detailed routing until a routable circuit floorplan has been generated. As a result, routability estimation allows a user to reduce the time required to generate a valid circuit floorplan by a number of days per iteration while generating a floorplan.

Local Routing Regions

FIG. 3A illustrates a local routing region 300 in accordance with an embodiment of the present invention. Local routing region 300 comprises a number of routing layers. A respective routing layer 302 includes an overflow 304, and a preferred direction 306. A negative overflow value r denotes an excess capacity of r routes associated with a respective routing layer, and a positive overflow value r denotes an overflow of r routes associated with the respective routing layer. Preferred direction 306 denotes a direction d of the routing layer that a route can follow without incurring an extra cost on the overflow. If a route follows a non-preferred direction $\bar{d}$ (which is orthogonal to the preferred direction d), the overflow will increase by a cost of n routing tracks instead of a cost associated with a single routing track. The cost n associated with a non-preferred direction is referred to as the non-preferred direction factor throughout the remainder of this disclosure, and denotes a number of tracks that are used to accommodate for a route in a non-preferred direction of a routing layer. The cost n can depend on the capacity of a respective routing layer.

FIG. 3B illustrates a local routing region 310, which is a simpler depiction of a local routing region in accordance with an embodiment of the present invention. Note that local routing region 310 is used throughout the remainder of this disclosure to simplify the explanation. Local routing region 310 includes two routing layers. A horizontal routing layer 312 is associated with a preferred horizontal route direction. Similarly, a vertical routing layer 314 is associated with a preferred vertical route direction. Horizontal routing layer 312 is associated with an overflow 316, and vertical routing layer 314 is associated with an overflow 318. Similar to local routing region 300, a negative overflow value r denotes an excess capacity of r routes, and a positive overflow value r denotes an overflow of r routes.

FIG. 4 illustrates an exemplary maze 400 comprising a number of local routing regions 402 in accordance with an embodiment of the present invention. For illustration purposes, maze 400 includes a layer 0 route 404 with a preferred horizontal direction, and includes a layer 1 route 406 with a preferred vertical direction. Layer 0 route 404 uses a preferred direction route between local routing regions A1 through C1, and uses a non-preferred direction route 408 between local routing regions A0 and A1. Non-preferred direction route 408 exists in the event that local routing regions A0 and A1 do not have an excess capacity for routes in a vertical routing layer (in this case, layer 1).

Similarly, layer 1 route 406 uses a preferred direction route between local routing regions D1 through D3, and uses a non-preferred direction route 410 between local routing regions C1 and D1. Non-preferred direction route 410 exists in the event that local routing regions C1 and D1 do not have an excess capacity for routes in a horizontal routing layer (in this case, layer 0).

Computing a Global Routability Estimation

Embodiments of the present invention provide a system for computing a global routability estimation by first transferring route overflow values onto local routing regions which are associated with an excess capacity of routes. In some variations of these embodiments, the system transfers route overflow values by emulating some of the capabilities of a detailed router.

FIG. 5 illustrates an exemplary outcome from transferring an overflow value to a receiving routing layer by using preferred directions for local routing regions in accordance with an embodiment of the present invention. FIG. 5A illustrates a maze 500 comprising a local routing region C1 with an overflowing vertical routing layer, and a corresponding route is illustrated in FIG. 5B.

Notice that the vertical routing layer of local routing region C1 has three overflowing routes, however FIG. 5B only illustrates one overflowing route that is to be transferred away from the overflowing layer of local routing region C1. The remainder of this disclosure only provides examples for transferring one overflow value away from an overflowing routing layer at a time; however, the operations disclosed herein can also be applied to transfer an overflow value greater than one.

FIG. 5A also illustrates maze 500 with a route window 502 associated with local routing region C1. A route window designates, for a respective routing layer of a local routing region with an overflow of routes, a range of local routing regions which can be used to receive the route overflow. In this example, a route window is set to a predetermined size of five local routing regions. For the route window 502 associated with the vertical routing layer of local routing region C1, it is a horizontal window which spans units A1 through E1.

The process for transferring a route overflow from the vertical routing layer for local routing region C1 begins by searching for a nearest local routing region with an excess capacity in the vertical routing layer, such that a path exists between the overflowing routing layer and the receiving routing layer. First, the neighboring regions B1 and D1 are considered. Notice that local routing region B1 does have an excess capacity in the vertical routing layer; however, a path does not exist to the vertical routing layer of region B1 from the vertical routing layer of region C1 because a horizontal path into region B1 does not exist (the horizontal routing layer for region B1 does not have a negative overflow, hence it does not have an excess capacity of routes). Local routing region D1 is not a candidate for receiving a route overflow in the vertical layer either because the vertical routing layer of region D1 does not have an excess capacity of routes.

Next, we consider local routing regions A1 and E1. Similar to local routing region B1, local routing region A1 does have an excess capacity in the vertical routing layer; however, a path does not exist to the vertical routing layer of region A1 from the vertical routing layer of region C1 because the horizontal routing layer of regions A1 and B1 do not have an excess capacity of routes. However, local routing region E1 is a nearest candidate for receiving a route overflow from region C1 because local routing region E1 has an excess capacity in the vertical routing layer, and a path exists to the vertical routing layer of region E1 from the vertical routing layer of region C1 because the horizontal routing layers of local routing regions C1, D1, and E1 have an excess capacity of routes as well.

In some embodiments, when the system searches for a receiving routing layer associated with a preferred routing direction d, the system accounts for every routing layer associated with the direction d of a candidate receiving local routing region. This allows for a local routing region with l routing layers associated with a combined excess capacity of r routes in a preferred direction d to act like a single routing layer associated with an excess capacity of r routes in the direction d.

FIG. 5C illustrates maze 500 with the final overflows after a route overflow is transferred from the vertical routing layer of local routing region C1 to the vertical routing layer of local routing region E1. Notice that maze 500 of FIG. 5C illustrates the adjusted weight estimations in bold, which clearly depicts the path taken between the vertical routing layers of local routing regions C1 and E1. The process of transferring the overflow value from the vertical routing layer of region C1 to the vertical routing layer of region E1 proceeds as follows: First, the overflow of the overflowing routing layer (in this case, the vertical routing layer of local routing region C1) is decremented by a value of 1. Next, a horizontal path is to be used between local routing regions C1 and E1; therefore, the overflows for the horizontal routing layers of local routing regions C1, D1, and E1 are respectively incremented by a value of 1. Finally, the vertical routing layer of local routing region E1 is incremented by a value of 1 to complete the transfer.

FIG. 5D illustrates maze 500 depicting the adjusted route between the vertical routing layers of local routing regions C1 and E1. Specifically, the route in the vertical routing layer of local routing region C1 (illustrated by a dashed line) is routed through the horizontal routing layer (illustrated by a solid line) across local routing regions C1 through E1, and ends with a route in the vertical routing layer of local routing region E1. Notice that the final adjusted route only uses the preferred direction for a respective routing layer (i.e., vertical routes exist in the vertical routing layers, and horizontal routes exist in the horizontal routing layers). The following example illustrated by FIG. 6 follows a case where the solution relies upon a non-preferred direction of a routing layer.

Whenever the system does not find a local routing region with an excess capacity of routes in a routing layer associated with a desired routing direction, the system initiates a second search for a local routing region with an excess capacity of n routes in a routing layer associated with a direction that is orthogonal to the desired routing direction. In this example, the non-preferred direction factor n is set to a value of three.

In some embodiments of the present invention, the characteristics and capabilities of a route window are determined by the characteristics and capabilities of a corresponding search window used by a detailed router being emulated. These characteristics and capabilities include, but are not limited to, any procedures for determining the location and/or dimensions of a respective route window, any search procedures for selecting a receiving local routing region and/or receiving routing layer associated with a respective route window, and any procedures for transferring an overflow value from an overflowing local routing region to a receiving routing layer of a receiving local routing region associated with a respective route window.

FIG. 6 illustrates an exemplary outcome from transferring an overflow value to a receiving routing layer by using the preferred and non-preferred directions in accordance with an embodiment of the present invention. FIG. 6A illustrates a maze 600 comprising a local routing region C1 with an overflowing routing layer in the vertical direction, and a corresponding route is illustrated in FIG. 6B.

FIG. 6A also illustrates maze 600 with a route window 602 associated with local routing region C1. Route window 602 is once again set to a predetermined size of five local routing regions. Similar to the example of maze 500, route window 602 is associated with the vertical routing layer of local routing region C1, and is a horizontal window spanning regions A1 through E1.

Once again, the process for transferring a route overflow from the vertical routing layer for local routing region C1 begins by searching for a nearest local routing region with an excess capacity in the vertical routing layer, such that a path exists between the overflowing routing layer and the receiving routing layer. First, the neighboring local routing regions B1 and D1 are considered. Neither have an excess capacity in the vertical routing layer, so local routing regions B1 and D1 are not proper candidates. Next, local routing regions A1 and E1 are considered; however, they are not proper candidates either because neither have an excess capacity in the vertical routing layer.

At this point, the limits of routing window 602 have been reached without identifying a local routing region associated with an excess capacity in the vertical routing layer. The process for transferring a route overflow from the vertical routing layer for local routing region C1 continues by searching for a nearest routing layer with an excess capacity of n routes in the horizontal routing layer. First, the horizontal routing layer for local routing region C1 is considered. This layer does not have a sufficient excess capacity to accommodate for a vertical route in the horizontal routing direction because a capacity of n=3 routes is required, and only two are available. Next, the neighboring local routing regions B1 and D1 are reconsidered. Both local routing regions B1 and D1 are proper candidates because they have an excess capacity of more than three routes in the horizontal routing layer, and a path exists to the horizontal routing layer of regions B1 and D1 from the vertical routing layer of region C1 because the horizontal routing layer of region C1 has an excess capacity of routes as well. This example selects local routing region B1 as the nearest candidate.

In some embodiments, when the system searches for a receiving routing layer associated with a non-preferred routing direction $\bar{d}$, the system accounts for every routing layer associated with the direction $\bar{d}$ of a candidate receiving local routing region. This allows for a local routing region with l routing layers associated with a combined excess capacity of r routes in a non-preferred direction $\bar{d}$ to act like a single routing layer associated with an excess capacity of r routes in the direction $\bar{d}$.

FIG. 6C illustrates maze 600 with the final overflows after a route overflow is transferred from the vertical routing layer of local routing region C1 to the horizontal routing layer of local routing region B1. Notice that maze 600 of FIG. 6C illustrates the adjusted weight estimations in bold, which clearly depicts the path taken between the vertical routing layer of local routing region C1 and the horizontal routing layer of local routing region B1. The process of transferring the overflow value from the vertical routing layer of region C1 to the horizontal routing layer of region B1 proceeds as follows: First, the overflow of the overflowing routing layer (in this case, the vertical routing layer of local routing region C1) is decremented by a value of 1. Next, a horizontal path is to be used through local routing region C1 to reach the horizontal routing layer of local routing region B1; therefore, the overflow for the horizontal routing layer of local routing region C1 is incremented by a value of 1. Finally, the horizontal routing layer of local routing region B1 is incremented by a value of n=3 to accommodate for the vertical route and complete the transfer.

FIG. 6D illustrates maze 600 depicting the adjusted route between the vertical routing layer of local routing region C1 and the horizontal routing layer of local routing region B1. Specifically, the route in the vertical routing layer of local routing region C1 (illustrated by a dashed vertical line) is routed through the horizontal routing layer across local routing region C1 (illustrated by a solid horizontal line), and ends with a vertical route in the horizontal routing layer of local routing region B1 (route 604, illustrated by a solid vertical line). Notice that the process of transferring an overflowing route from the vertical routing layer of local routing region C1 was forced to rely upon the non-preferred direction of the horizontal routing layer of local routing region B1, as is illustrated by route 604.

Figure 7:
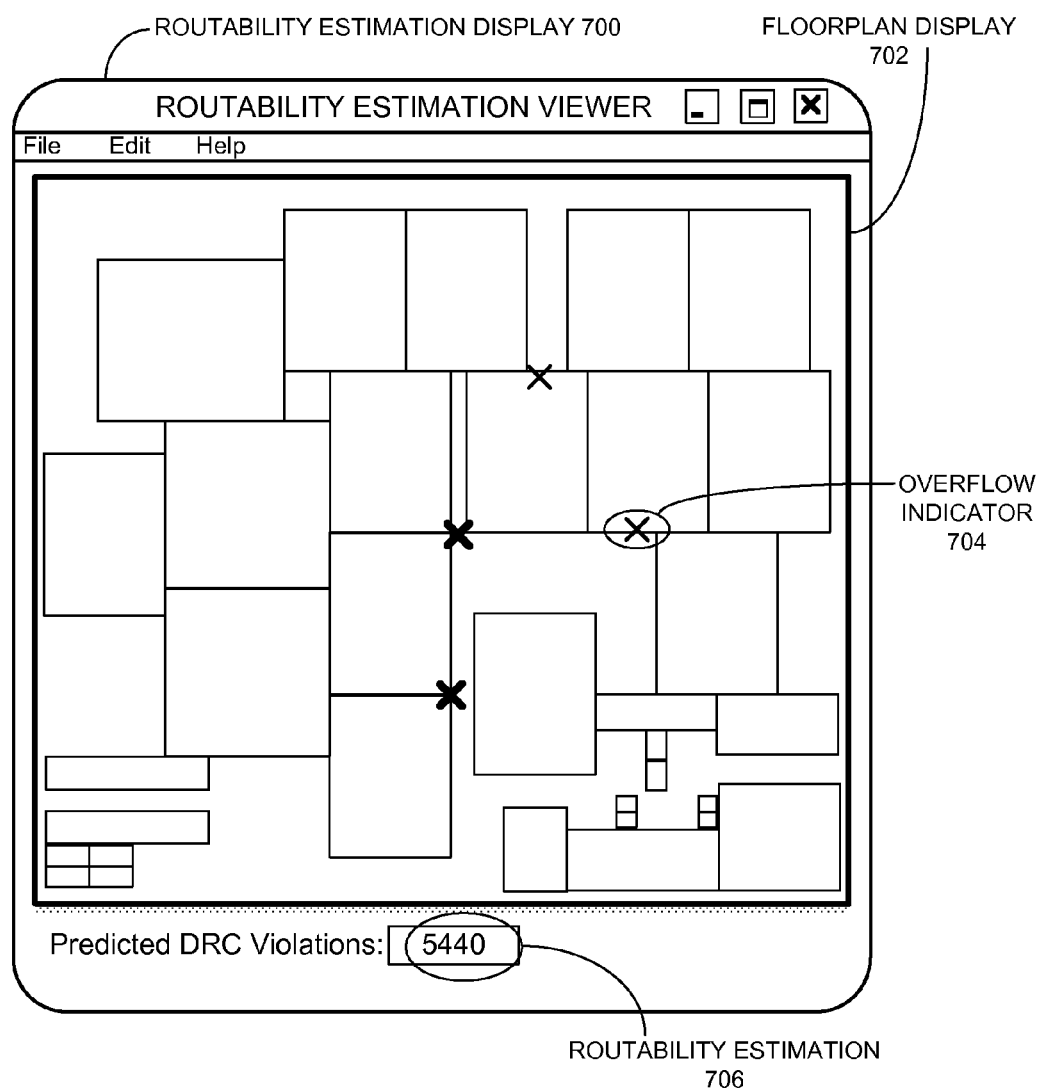
FIG. 7 illustrates an exemplary routability estimation display in accordance with an embodiment of the present invention.

FIG. 7 illustrates an exemplary routability estimation display 700 in accordance with an embodiment of the present invention. Routability estimation display 700 includes a floorplan display 702, overflow indicators 704, and a routability estimation 706. Floorplan display 702 illustrates the floorplan being routed, and includes on this display a number of overflow indicators 704 on the locations of the floorplan associated with local routing regions with an overflow greater than zero. Routability estimation display 700 also displays routability estimation 706, which is a prediction of the number of violations that will be encountered by a design rule check (DRC) after a detailed routing procedure is performed on the floorplan.

Figure 8:
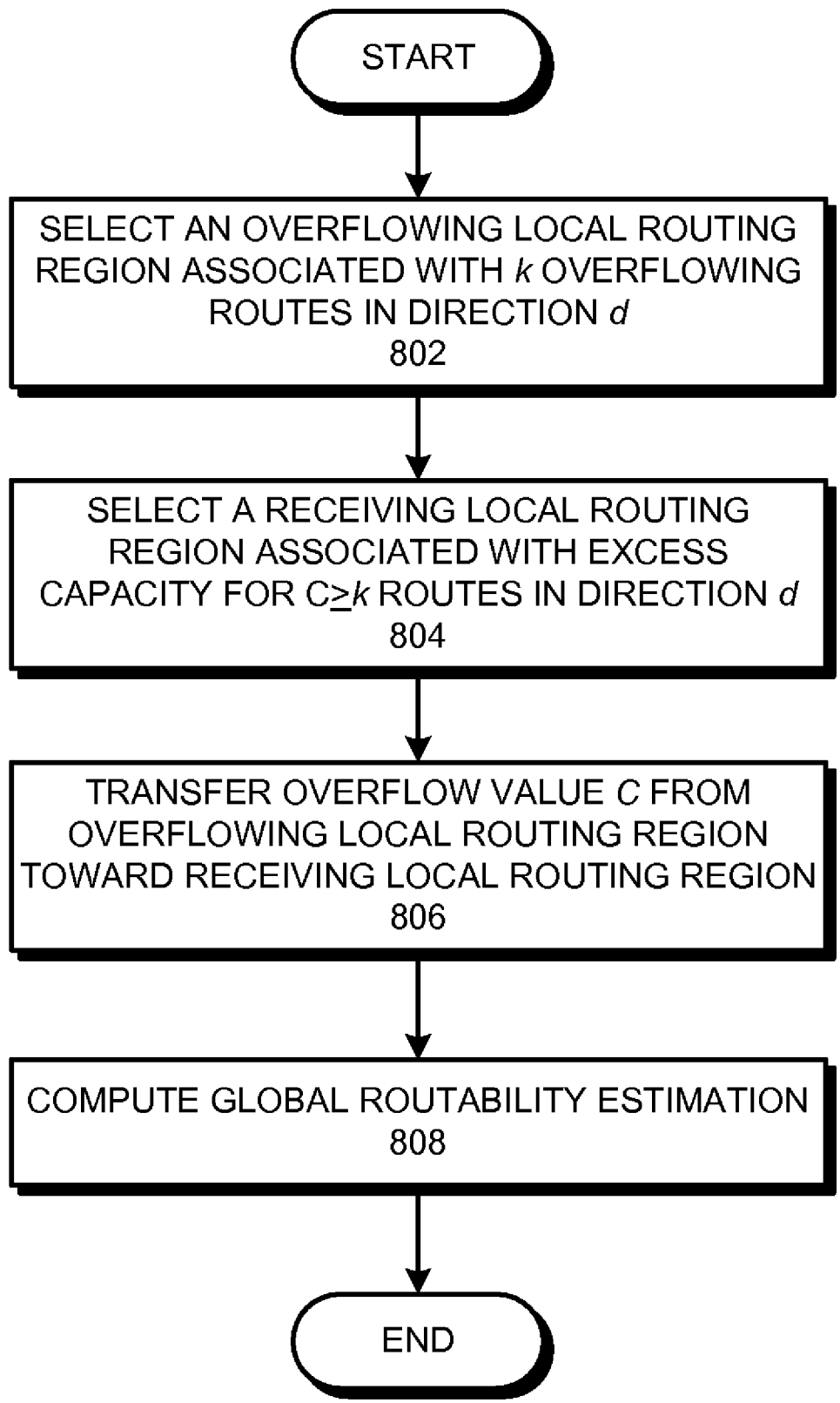
FIG. 8 presents a flowchart illustrating a process for computing a global routability estimation in accordance with an embodiment of the present invention.

FIG. 8 presents a flowchart illustrating a process for computing a global routability estimation in accordance with an embodiment of the present invention. The system begins by selecting an overflowing local routing region associated with k overflowing routes in a direction d (operation 802). Next, the system selects a receiving local routing region associated with an excess capacity of C≧k routes in the direction d (operation 804). The system continues by transferring an overflow value C from the overflowing local routing region toward the receiving local routing region (operation 806). After the system has completed transferring overflow values away from overflowing local routing regions, the system computes a global routability estimation as a function of a global overflow cost and an adjacent overflow cost (operation 808). The global overflow cost is associated with the route overflow values across every layer of every local routing region in a maze. The adjacent overflow cost is associated with the number of route overflows per cluster of overflowing local routing regions, and the size of a respective cluster, throughout the maze.

Figure 9:
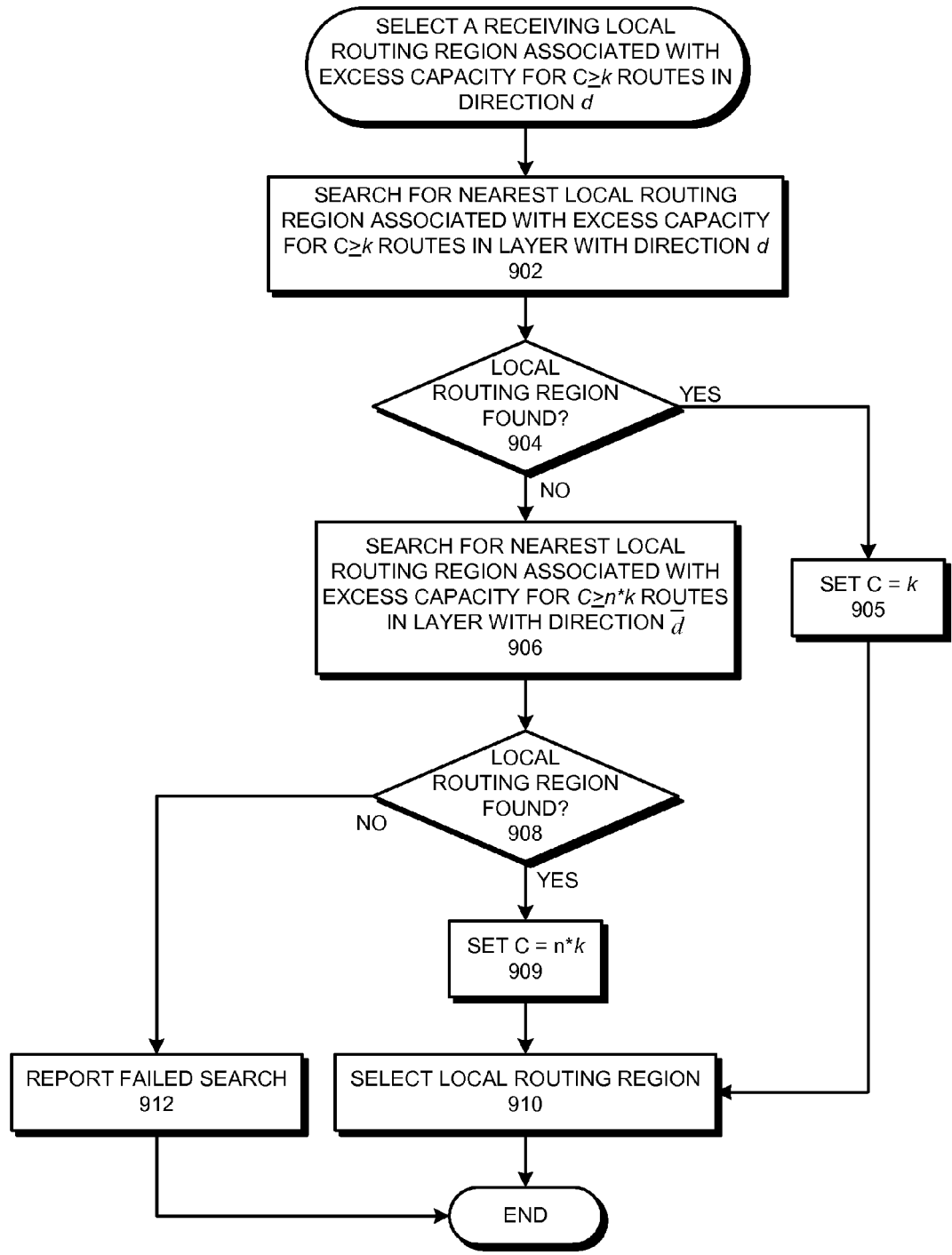
FIG. 9 presents a flowchart illustrating a process for selecting a receiving local routing region with an excess capacity for C≧k routes in a direction d in accordance with an embodiment of the present invention.

FIG. 9 presents a flowchart illustrating a process for selecting a receiving local routing region with an excess capacity for C≧k routes in a direction d, which expands upon operation 804 of FIG. 8, in accordance with an embodiment of the present invention. The system begins by searching for a local routing region associated with an excess capacity for C≧k routes in a routing layer with a preferred direction d that is nearest to the overflowing local routing region (operation 902). Next, the system determines whether a local routing region has been found (operation 904). If a local routing region is found by operation 902, the system sets the variable C to the value k (operation 905) and proceeds to operation 910 to select the local routing region. Otherwise, the system performs a second search for a local routing region associated with an excess capacity for C≧n*k routes in a routing layer with a preferred direction $\overline{d}$ that is nearest to the overflowing local routing region (operation 906), wherein n is a predetermined non-preferred direction factor. The system determines once again whether a local routing region has been found (operation 908). If a local routing region is found by operation 906, the system sets the variable C to n*k (operation 909) and selects the local routing region (operation 910). Otherwise, the system reports a failed search (operation 912).

Note that a search performed by either operation 902 or operation 906 only selects a local routing region as the receiving local routing region when a path exists from the overflowing local routing region to the receiving routing layer of the selected local routing region through a number of adjoining local routing regions with an excess capacity of k or more routes.

Figure 10:
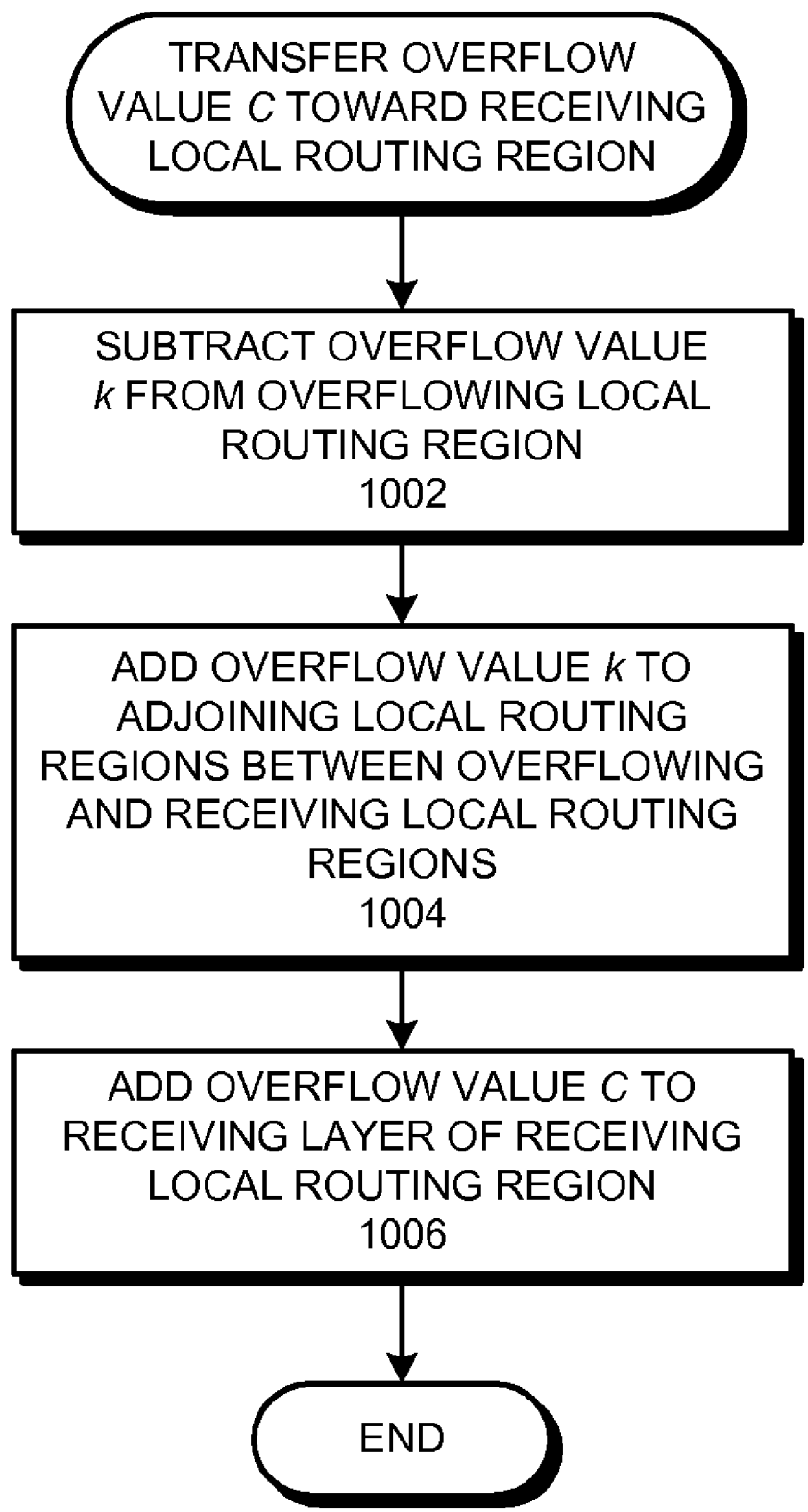
FIG. 10 presents a flowchart illustrating a process for transferring an overflow value C toward a receiving local routing region in accordance with an embodiment of the present invention.

FIG. 10 presents a flowchart illustrating a process for transferring an overflow value C from an overflowing local routing region toward a receiving local routing region, which expands upon operation 806 of FIG. 8, in accordance with an embodiment of the present invention. The system begins by subtracting the overflow value k from the overflowing routing layer of the overflowing routing region (operation 1002). Next, the system adds the overflow value k to the adjoining local routing regions between the overflowing local routing region and the receiving local routing region (operation 1004). Finally, the system adds the overflow value C to the receiving layer of the receiving local routing region (operation 1006).

Note that C is set to k if the direction d is associated with the preferred direction of the receiving routing layer, and C is set to n*k if the direction d is associated with the non-preferred direction of the receiving routing layer. Also, note that in operation 1004, a transfer in the horizontal direction through an adjoining local routing region adds the value k to a horizontal routing layer of the adjoining local routing region. Similarly, a transfer in the vertical direction through an adjoining local routing region adds the value k to a vertical routing layer of the adjoining local routing region.

Figure 11:
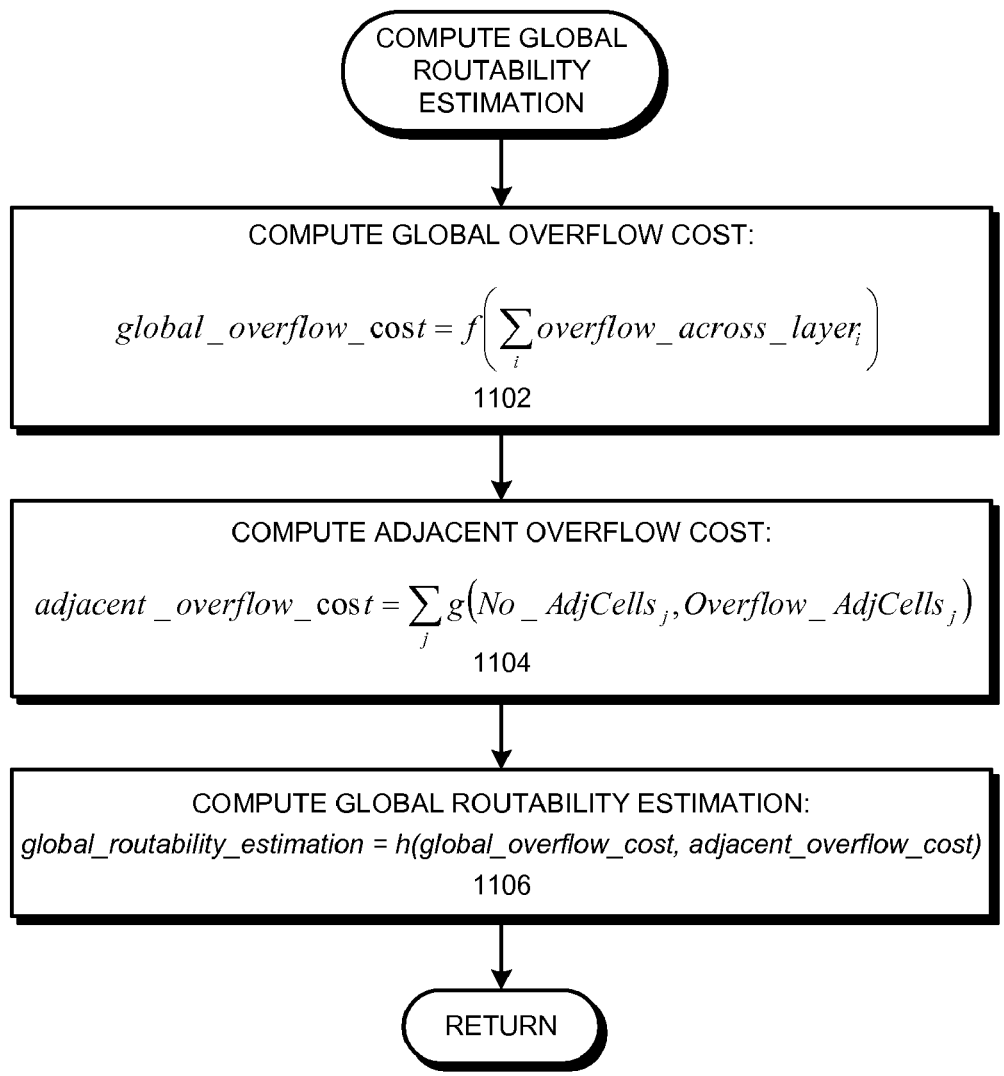
FIG. 11 presents a flowchart illustrating a process for computing a global routability estimation in accordance with an embodiment of the present invention.

FIG. 11 presents a flowchart illustrating a process for computing a global routability estimation, which expands upon operation 808 of FIG. 8, in accordance with an embodiment of the present invention. The system begins by computing a global overflow cost as a function $f$ of the sum of overflows across every layer i of every local routing region (operation 1102):

$$\text{global\_overflow\_cost} = f\left(\sum_i \text{overflow\_across\_layer}_i\right).$$

The system continues by computing an adjacent overflow cost as the sum of the costs across a number of clusters j of adjacent local routing regions with route overflows, wherein the cost g of a cluster is a function of the number of local routing regions in the cluster and the sum of the overflows across the cluster (operation 1104):

$$\text{adjacent\_overflow\_cost} = \sum_j g(\text{No\_AdjCells}_j, \text{Overflow\_AdjCells}_j).$$

Finally, the system computes the global routability estimation across a collection of local routing regions as a function h of the global overflow cost and the adjacent overflow cost (operation 1106):

global routability estimation=$h$(global_overflow_cost, adjacent_overflow_cost).

In one embodiment of the present invention, function h is a linear operation. In variations of this embodiment, function h is an addition operation. Embodiments of the present invention can tailor the global routability estimation computation for a variety of circuit structures and fabrication technologies by adapting the computations performed by functions $f$, g, and h.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for computing a routability estimation across a collection of local routing regions associated with a circuit layout, comprising:
   selecting a first local routing region associated with a route overflow, wherein a respective local routing region is associated with an estimation of a number of route overflows for routing layers in a region of the circuit layout, wherein the first local routing region includes an overflowing routing layer which is associated with an overflow of k or more routes in a direction d, and wherein a respective routing layer is associated with a preferred direction D and is associated with either an overflow of R routes or an excess capacity of C routes;
   identifying a second local routing region, wherein the second local routing region has an excess capacity in the direction d to accommodate the overflow in the overflowing routing layer, wherein an excess path exists between the overflowing routing layer of the first local routing region and the second local routing region, and wherein the excess path is orthogonal to the direction d;
   transferring the overflow value k away from the overflowing routing layer to the second local routing region;
   computing a global overflow cost which involves summing route overflows across every layer of every local routing region; and computing an adjacent overflow cost which involves summing values of a cost function across a number of clusters of adjacent local routing regions with route overflows, wherein a value of the cost function for a cluster depends on a number of local routing regions in the cluster and a sum of the overflows across the cluster; and computing, by computer, a global routability estimation as a function of the global overflow cost and the adjacent overflow cost.

2. The method of claim 1, wherein transferring an overflow value k away from an overflowing routing layer for the first local routing region, which is associated with an overflow of k or more routes in the direction d, to a second local routing region comprises:

performing a first search for a second local routing region comprising a receiving routing layer associated with an excess capacity of at least C=k routes in the preferred direction d;

if the first search does not succeed, performing a second search for a second local routing region comprising a receiving routing layer associated with an excess capacity of at least C=n*k routes in a non-preferred direction $\bar{d}$, wherein n is a non-preferred direction factor which denotes a number of tracks that are used to accommodate for a route in the non-preferred direction of a routing layer; and if the second local routing region is found, transferring the overflow value C to the receiving layer of the second local routing region;

wherein the non-preferred direction $\bar{d}$ is orthogonal to the preferred direction d.

3. The method of claim 2, wherein searching for the second local routing region comprises ensuring that a path exists from the first local routing region to the second local routing region through a number of adjoining local routing regions associated with an excess capacity of k or more routes on layers using the preferred routing direction.

4. The method of claim 3, wherein transferring the overflow value C to the receiving layer of the second local routing region comprises:

subtracting k overflow values from the overflowing routing layer of the first local routing region;

adding k overflow values to the preferred routing direction layers of the adjoining local routing regions between the first local routing region and the second local routing region; and adding C overflow values to the receiving routing layer of the second local routing region.

5. The method of claim 1, wherein computing the global overflow cost across a collection of local routing regions comprises computing the cost as a function $f$ of the sum of overflows across every layer i of every local routing region:

$$\text{global\_overflow\_cost} = f\left(\sum_i \text{overflow\_across\_layer}_i\right).$$

6. The method of claim 1, wherein computing the adjacent overflow cost comprises computing the sum of the costs across a number of clusters j of adjacent local routing regions with route overflows, wherein the cost g of a cluster is a function of the number of local routing regions in the cluster and the sum of the overflows across the cluster:

$$\text{adjacent\_overflow\_cost} = \sum_j g(\text{No\_AdjCells}_j, \text{Overflow\_AdjCells}_j).$$

7. The method of claim 1, wherein a local routing region is associated with an estimation of overflows and excess capacity in a first routing layer with a corresponding direction D=d, and is associated with an estimation of overflows and excess capacity in a second routing layer with a corresponding direction D=$\bar{d}$; and wherein the direction $\bar{d}$ is orthogonal to the direction d.

8. The method of claim 7, wherein the estimation of overflows at a layer in a local routing region is represented by a positive value of a variable OV, and wherein the estimation of excess capacity at the layer in the local routing region is represented by a negative value of the variable OV.

9. A non-transitory computer-readable storage medium storing instructions that when executed by a computer cause the computer to perform a method for computing a routability estimation across a collection of local routing regions associated with a circuit layout, the method comprising:

selecting a first local routing region associated with a route overflow, wherein a respective local routing region is associated with an estimation of a number of route overflows for routing layers in a region of the circuit layout, wherein the first local routing region includes an overflowing routing layer which is associated with an overflow of k or more routes in a direction d, and wherein a respective routing layer is associated with a preferred direction D and is associated with either an overflow of R routes or an excess capacity of C routes;

identifying a second local routing region, wherein the second local routing region has an excess capacity in the direction d to accommodate the overflow in the overflowing routing layer, wherein an excess path exists between the overflowing routing layer of the first local routing region and the second local routing region, and wherein the excess path is orthogonal to the direction d;

transferring the overflow value k away from the overflowing routing layer to the second local routing region;

computing a global overflow cost which involves summing route overflows across every layer of every local region; and computing an adjacent overflow cost which involves summing values of a cost function across a number of clusters of adjacent local routing regions with route overflows, wherein a value of the cost function for a cluster depends on a number of local routing regions in the cluster and a sum of the overflows across the cluster; and computing a global routability estimation as a function of a global overflow cost and an adjacent overflow cost.

10. The non-transitory computer-readable storage medium of claim 9, wherein transferring an overflow value k away from an overflowing routing layer for the first local routing region, which is associated with an overflow of k or more routes in the direction d, to a second local routing region comprises:

performing a first search for a second local routing region comprising a receiving routing layer associated with an excess capacity of at least C=k routes in the preferred direction d;

if the first search does not succeed, performing a second search for a second local routing region comprising a receiving routing layer associated with an excess capacity of at least C=n*k routes in a non-preferred direction $\bar{d}$, wherein n is a non-preferred direction factor which denotes a number of tracks that are used to accommodate for a route in the non-preferred direction of a routing layer; and if the second local routing region is found, transferring the overflow value C to the receiving layer of the second local routing region;

wherein the non-preferred direction $\overline{d}$ is orthogonal to the preferred direction d.

11. The non-transitory computer-readable storage medium of claim 10, wherein searching for the second local routing region comprises ensuring that a path exists from the first local routing region to the second local routing region through a number of adjoining local routing regions associated with an excess capacity of k or more routes on layers using the preferred routing direction.

12. The non-transitory computer-readable storage medium of claim 11, wherein transferring the overflow value C to the receiving layer of the second local routing region comprises:
    subtracting k overflow values from the overflowing routing layer of the first local routing region;
    adding k overflow values to the preferred routing direction layers of the adjoining local routing regions between the first local routing region and the second local routing region; and
    adding C overflow values to the receiving routing layer of the second local routing region.

13. The non-transitory computer-readable storage medium of claim 9, wherein computing the global overflow cost across a collection of local routing regions comprises computing the cost as a function $f$ of the sum of overflows across every layer i of every local routing region:

$$\text{global\_overflow\_cost} = f\left(\sum_i \text{overflow\_across\_layer}_i\right).$$

14. The non-transitory computer-readable storage medium of claim 9, wherein computing the adjacent overflow cost comprises computing the sum of the costs across a number of clusters j of adjacent local routing regions with route overflows, wherein the cost g of a cluster is a function of the number of local routing regions in the cluster and the sum of the overflows across the cluster:

$$\text{adjacent\_overflow\_cost} = \sum_j g(\text{No\_AdjCells}_j, \text{Overflow\_AdjCells}_j).$$

15. The non-transitory computer-readable storage medium of claim 9, wherein a local routing region is associated with an estimation of overflows and excess capacity in a first routing layer with a corresponding direction D=d, and is associated with an estimation of overflows and excess capacity in a second routing layer with a corresponding direction D=$\overline{d}$; and
    wherein the direction $\overline{d}$ is orthogonal to the direction d.

16. The non-transitory computer-readable storage medium of claim 15, wherein the estimation of overflows at a layer in a local routing region is represented by a positive value of a variable OV, and wherein the estimation of excess capacity at the layer in the local routing region is represented by a negative value of the variable OV.

17. An apparatus for computing a routability estimation across a collection of local routing regions associated with a circuit layout, comprising:
    a selection mechanism configured to select a first local routing region associated with a route overflow, wherein a respective local routing region is associated with an estimation of a number of route overflows for routing layers in a region of the circuit layout, wherein the first local routing region includes an overflowing routing layer which is associated with an overflow of k or more routes in a direction d, and wherein a respective routing layer is associated with a preferred direction D and is associated with either an overflow of R routes or an excess capacity of C routes;
    an identifying mechanism configured to identify a second local routing region, wherein the second local routing region has an excess capacity in the direction d to accommodate the overflow in the overflowing routing layer, wherein an excess path exists between the overflowing routing layer of the first local routing region and the second local routing region, and wherein the excess path is orthogonal to the direction d;
    a transfer mechanism configured to transfer the overflow value k away from the overflowing routing layer to the second local routing region; and
    a computing mechanism configured to:
        compute a global overflow cost which involves summing route overflows across every layer of every local routing region, compute an adjacent overflow cost which involves summing values of a cost function across a number of clusters of adjacent local routing regions with route overflows, wherein a value of the cost function for a cluster depends on a number of local routing regions in the cluster and a sum of the overflows across the cluster, and
        compute a global routability estimation as a function of the global overflow cost and the adjacent overflow cost.

18. The apparatus of claim 17, wherein while transferring an overflow value k away from an overflowing routing layer for the first local routing region, which is associated with an overflow of k or more routes in the direction d, to a second local routing region, the transfer mechanism is configured to:
    perform a first search for a second local routing region comprising a receiving routing layer associated with an excess capacity of at least C=k routes in the preferred direction d;
    if the first search does not succeed, perform a second search for a second local routing region comprising a receiving routing layer associated with an excess capacity of at least C=n*k routes in a non-preferred direction $\overline{d}$, wherein n is a non-preferred direction factor which denotes a number of tracks that are used to accommodate for a route in the non-preferred direction of a routing layer; and
    if the second local routing region is found, transfer the overflow value C to the receiving layer of the second local routing region;
    wherein the non-preferred direction $\overline{d}$ is orthogonal to the preferred direction d.

19. The apparatus of claim 18, wherein while searching for the second local routing region, the transfer mechanism is configured to ensure that a path exists from the first local routing region to the second local routing region through a number of adjoining local routing regions associated with an excess capacity of k or more routes on layers using the preferred routing direction.

20. The apparatus of claim 19, wherein while transferring the overflow value C to the receiving layer of the second local routing region, the transfer mechanism is configured to:
    subtract k overflow values from the overflowing routing layer of the first local routing region;

add k overflow values to the preferred routing direction layers of the adjoining local routing regions between the first local routing region and the second local routing region; and add C overflow values to the receiving routing layer of the second local routing region.

21. The apparatus of claim 17, wherein while computing the global overflow cost across a collection of local routing regions, the computing mechanism is configured to compute the cost as a function $f$ of the sum of overflows across every layer i of every local routing region:

$$\text{global\_overflow\_cost} = f\left(\sum_i \text{overflow\_across\_layer}_i\right).$$

22. The apparatus of claim 17, wherein while computing the adjacent overflow cost, the computing mechanism is configured to compute the sum of the costs across a number of clusters j of adjacent local routing regions with route overflows, wherein the cost g of a cluster is a function of the number of local routing regions in the cluster and the sum of the overflows across the cluster:

$$\text{adjacent\_overflow\_cost} = \sum_j g(\text{No\_AdjCells}_j, \text{Overflow\_AdjCells}_j).$$

23. The apparatus of claim 17, wherein a local routing region is associated with an estimation of overflows and excess capacity in a first routing layer with a corresponding direction D=d, and is associated with an estimation of overflows and excess capacity in a second routing layer with a corresponding direction D=$\bar{d}$; and wherein the direction $\bar{d}$ is orthogonal to the direction d.

24. The apparatus of claim 23, wherein the estimation of overflows at a layer in a local routing region is represented by a positive value of a variable OV, and wherein the estimation of excess capacity at the layer in the local routing region is represented by a negative value of the variable OV.

25. The apparatus of claim 17, wherein the selection mechanism emulates the capabilities associated with a search window of a detailed router, and wherein the transfer mechanism emulates the routing capabilities of a detailed router.

* * * * *